(12) United States Patent
Hsu et al.

(10) Patent No.: US 11,804,578 B2
(45) Date of Patent: Oct. 31, 2023

(54) MICRO LIGHT-EMITTING DEVICE AND DISPLAY

(71) Applicant: XIAMEN SAN'AN OPTOELECTRONICS CO., LTD., Xiamen (CN)

(72) Inventors: Chen-ke Hsu, Xiamen (CN); Chia-en Lee, Xiamen (CN); Chun-Yi Wu, Tianjin (CN); Shaohua Huang, Xiamen (CN)

(73) Assignee: Xiamen San'An Optoelectronics Co., Ltd., Xiamen (CN)

( * ) Notice: Subject to any disclaimer, the term of this patent is extended or adjusted under 35 U.S.C. 154(b) by 322 days.

(21) Appl. No.: 17/142,901

(22) Filed: Jan. 6, 2021

(65) Prior Publication Data
US 2021/0159370 A1    May 27, 2021

Related U.S. Application Data

(63) Continuation-in-part of application No. PCT/CN2019/074128, filed on Jan. 31, 2019.

(30) Foreign Application Priority Data

Jul. 16, 2018 (CN) .......................... 201810775466.7

(51) Int. Cl.
*H01L 33/50* (2010.01)
*H01L 33/06* (2010.01)
(Continued)

(52) U.S. Cl.
CPC ............ *H01L 33/504* (2013.01); *H01L 33/06* (2013.01); *H01L 33/30* (2013.01); *H01L 33/60* (2013.01)

(58) Field of Classification Search
CPC ....... H01L 33/504; H01L 33/06; H01L 33/30; H01L 33/60
See application file for complete search history.

(56) References Cited

U.S. PATENT DOCUMENTS

2003/0205714 A1* 11/2003 Sugawara ............... H01L 33/32
257/89
2007/0045609 A1* 3/2007 Saxler ..................... H01L 33/08
257/14

(Continued)

FOREIGN PATENT DOCUMENTS

CN        103155186 A     6/2013
CN        106098720 A     11/2016
(Continued)

OTHER PUBLICATIONS

Search Report issued to PCT application No. PCT/CN2019/074128 by the WIPO dated May 6, 2019.
(Continued)

*Primary Examiner* — Mark W Tornow
(74) *Attorney, Agent, or Firm* — Thomas | Horstemeyer, LLP

(57) ABSTRACT

A micro light-emitting device includes a micro light-emitting diode and a light-emitting structure. The micro light-emitting diode includes a semiconductor light-emitting unit that emits an excitation light having a first wavelength. The light-emitting structure is disposed on the micro light-emitting diode, and is configured to be excited by the excitation light to emit an excited light having a second wavelength. The light-emitting structure is a multiple quantum well structure. A display including the micro light-emitting device is also disclosed.

22 Claims, 9 Drawing Sheets

(51) Int. Cl.
  *H01L 33/30*   (2010.01)
  *H01L 33/60*   (2010.01)

(56) References Cited

U.S. PATENT DOCUMENTS

2018/0074372 A1*  3/2018  Takeya ................ H01L 25/0753
2018/0097146 A1*  4/2018  Bauer .................... H01L 33/06
2018/0206299 A1*  7/2018  Chen ....................... H01L 33/52

FOREIGN PATENT DOCUMENTS

CN       106486587 A     3/2017
CN       109037405 A    12/2018

OTHER PUBLICATIONS

Search Report appended to an Office Action, which was issued to Chinese counterpart Application No. CN202011101800.4 by the CNIPA dated Sep. 6, 2021.

\* cited by examiner

MICRO LIGHT-EMITTING DEVICE AND DISPLAY

CROSS-REFERENCE TO RELATED APPLICATION

This application is a bypass continuation-in-part application of International Application No. PCT/CN2019/074128 filed on Jan. 31, 2019, which claims priority of Chinese Invention Patent Application No. 201810775466.7 filed on Jul. 16, 2018. The entire content of each of the International and Chinese patent applications is incorporated herein by reference.

FIELD

The disclosure relates to a semiconductor device, and more particularly to a micro light-emitting device and a display including the same.

BACKGROUND

A micro light-emitting diode (μLED) is widely studied as a next generation light source for displays. The μLED has the advantages of low power consumption, high brightness, ultra-high image resolution, ultra-high color saturation, fast response speed, and long service life. Generally, the power consumption of the μLED is about 10% of that of a liquid crystal display (LCD), and 50% of that of an organic light-emitting diode (OLED). In addition, the μLED may have a brightness that is 30 times greater than the brightness of the OLED, and an image resolution of 1500 pixels per inch (PPI). As such, the μLED, in replacement of the OLED and LCD, is a promising light source for next generation displays.

A μLED display is prepared to have a plurality of pixels (such as red, green, and blue pixels) that include red, green, and blue μLEDs. It is noted that the μLED is still not adapted for mass production due to several technical issues yet to be resolved. For example, since phosphors are usually adispersed in a conventional phosphor-converted μLED, an uniformity of light output of the μLED is difficult to be controlled, resulting in a light leakage. In addition, a quantum dot-based μLED is not adapted for mass production due to high cost. As compared with blue and green μLEDs, the red μLED made of an AlGaInP-based material is susceptible to electrical leakage and non-radiative recombination, such that the brightness of the red μLED is adversely affected and thus, the visual effect of the μLED display is reduced.

SUMMARY

An object of the disclosure is to provide a micro light-emitting device that can alleviate at least one of the drawbacks of the prior art.

According to the disclosure, the micro light-emitting device includes a micro light-emitting diode and a light-emitting structure.

The micro light-emitting diode includes a semiconductor light-emitting unit that emits an excitation light having a first wavelength.

The light-emitting structure is disposed on the micro light-emitting diode, and is configured to be excited by the excitation light to emit an excited light having a second wavelength. The light-emitting structure is a multiple quantum well structure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
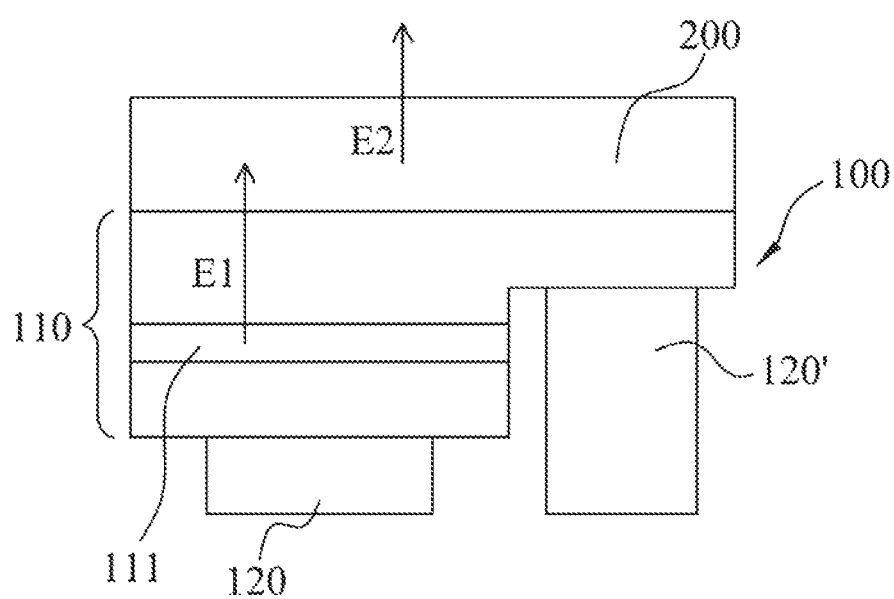
FIG. 1 is a cross-sectional view illustrating a first embodiment of a micro light-emitting device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Unless otherwise defined, all technical and scientific terms used herein have the meaning commonly understood by a person skilled in the art to which this disclosure belongs. One skilled in the art will recognize many methods and materials similar or equivalent to those described herein, which could be used in the practice of this disclosure. Indeed, this disclosure is in no way limited to the methods and materials described.

Referring to FIG. 1, a first embodiment of a micro light-emitting device according to the present disclosure includes a micro light-emitting diode 100 and a light-emitting structure 200.

One of a length, a width, and a height of the micro light-emitting diode 100 may range from 2 μm to 100 μm, such as from 2 μm to 5 μm, from 5 μm to 10 μm, from 10 μm to 20 μm, from 20 μm to 50 μm and from 50 μm to 100 μm. The micro light-emitting diode 100 includes a semiconductor light-emitting unit 110 that emits an excitation light E1 having a first wavelength. In this embodiment, the semiconductor light-emitting unit 110 includes a quantum well structure 111 made of a GaN-based material.

The light-emitting structure 200 used for photon conversion is disposed on the micro light-emitting diode 100, and is configured to be excited by the excitation light E1 to emit, an excited light E2 having a second wavelength. In this embodiment, the light-emitting structure 200 is a multiple quantum well structure which is made of an AlGaInP-based material.

The light-emitting structure 200 may be bonded to the micro light-emitting diode 100 through a bonding method or via a van der Waals force.

The first wavelength of the excitation light E1 may be shorter than the second wavelength of the excited light E2. The first wavelength may range from 380 nm to 550 nm, such as from 380 nm to 500 nm and from 500 nm to 550 nm. Since a photon conversion efficiency of the light-emitting structure 200 excited by a green light may be greater than that of the light-emitting structure 200 excited by a blue light, in this embodiment, the excitation light E1 is a green light having the first wavelength ranging from 500 nm to 550 nm. The second wavelength of the excited light E2 may range from 570 nm to 780 nm.

The micro light-emitting device further includes electrodes 120, 120' electrically connected to the semiconductor light-emitting unit 110. In this embodiment, the electrodes 120, 120' are disposed on the same side as the semiconductor light-emitting unit 110. That is, the micro light-emitting device has a flip chip structure.

Figure 2:
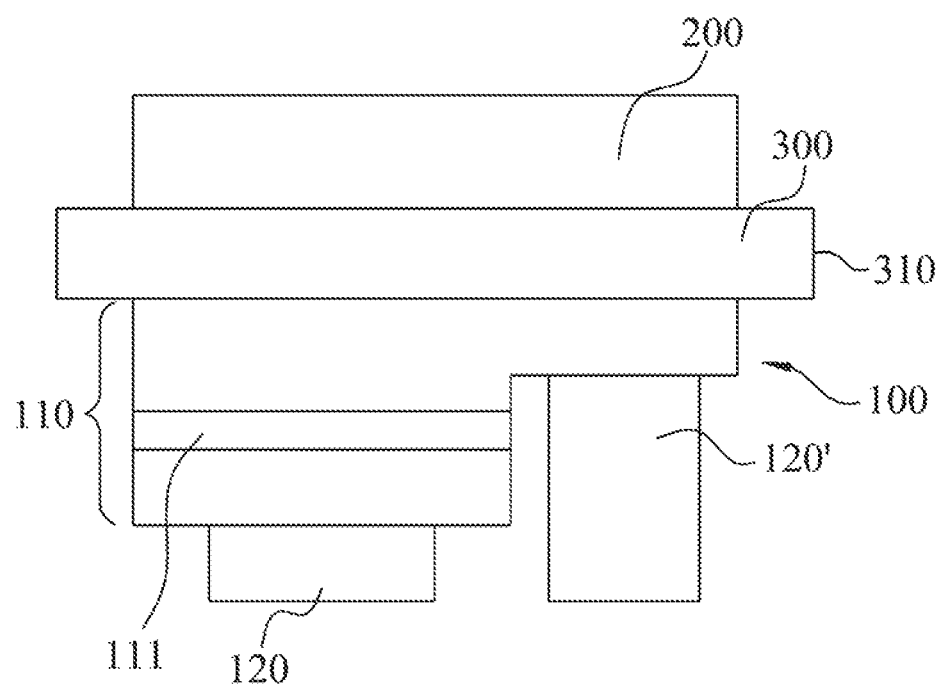
FIG. 2 is a cross-sectional view illustrating a variation of the first embodiment.

Referring to FIG. 2, in a variation of the first embodiment, the micro light-emitting device further includes a bonding layer 300 disposed between the micro light-emitting diode 100 and the light-emitting structure 200. The bonding layer 300 may be made of a transparent insulating dielectric material having an excellent light transmittance. Examples of the dielectric material for making the bonding layer 300 may include, but are not limited to, silicon dioxide ($SiO_2$), silicon nitride (SiN), indium tin oxide (ITO), aluminium oxide ($Al_2O_3$), resin (e.g., acrylic), silicone, and combinations thereof. The bonding layer 300 may have a thickness ranging from 0.01 μm to 100 μm, such as from 0.01 μm to 10 μm and from 10 μm to 100 μm, so as to prevent the excitation light E1 from being absorbed by the bonding layer 300 and from leaking through a sidewall 310 of the bonding layer 300, thereby increasing the light-emitting efficiency of the micro light-emitting device.

In addition, the light-emitting structure 200 includes multiple pairs of layers. The layers in each pair include a barrier layer and a well layer. The barrier layers and the well layers in the light-emitting structure 200 are alternately stacked. In this variation of the first embodiment, each of the well layers is made of $Ga_{0.51}In_{0.49}P$ that has a lattice-matched property, a direct energy bandgap (Eg=1.91 ev), a better light conversion efficiency, and an emission peak wavelength of 652 nm. Each of the well layers or the light-emitting structure 200 may have a thickness ranging from 3.8 nm to 4.2 nm, such as from 3.8 nm to 4.0 nm and from 4.0 nm to 4.2 nm. By adjusting the thickness of each of the well layers, the light-emitting structure 200 may have an emission peak wavelength ranging from 615 nm to 645 nm. For example, when the thickness of each of the well layers of the light-emitting structure 200 is 4.0 nm, a quantum effect is produced, and the light-emitting structure 200 may have an equivalent energy bandgap (Eg) of 1.987 eV and an emission peak wavelength of 624 nm, so that the light-emitting structure 200 can be adapted for use in μLEDs.

Each of the barrier layers of the light-emitting structure 200 may be made of AlInP that has a direct bandgap (Eg) of 2.36 eV which is close to an emission peak wavelength of the green light. Each of the barrier layers of the light-emitting structure 200 may have a thickness ranging from 1.5 nm to 3 nm, which is conducive for reducing the absorption of blue/green light. In an exemplary embodiment, each of the barrier layers of the light-emitting structure 200 has a thickness of 2 nm, such that a tunneling probability thereof is estimated to be not greater than 10% (the photon energy of the green light is about 2.35 eV).

The light-emitting structure 200 may have an absorption coefficient (a) of green light that is not greater than 30000 $cm^{-1}$. When the excitation light E1 is green light and the thickness of the light-emitting structure 200 is about 300 nm, the light-emitting structure 200 may fully absorb and be excited by the excitation light E1 to emit a red light. That is, the micro light-emitting device may be configured to emit only the excited light E2 (without the excitation light E1). In such case, the light-emitting structure 200 may include at least 20 pairs of layers. When the first wavelength of the excitation light E1 ranges from 500 nm to 550 nm, a number of the pairs of layers of the light-emitting structure 200 may range from 65 to 75, such as from 65 to 70 or from 70 to 75. In an exemplary embodiment, the light-emitting structure 200 includes 70 pairs of layers, so as to avoid excess light absorption caused by excessive pairs of layers.

The light-emitting structure 200 may have an absorption coefficient (a) of blue light that is not greater than 50000 $cm^{-1}$. When the excitation light E1 is a blue light and the thickness of the light-emitting structure 200 is about 200 nm, the light-emitting structure 200 may fully absorb and be excited by the excitation light E1 to emit a red light. In such case, the light-emitting structure 200 may include at least 20 pairs of layers. When the first wavelength of the excitation light E1 ranges from 380 nm to 500 nm, the number of the pairs of layers of the light-emitting structure 200 may range from 45 to 55, such as from 45 to 50 or from 50 to 55. In an exemplary embodiment, the light-emitting structure 200 includes 50 pairs of layers, so as to entirely prevent the blue light from passing therethrough.

Figure 3:
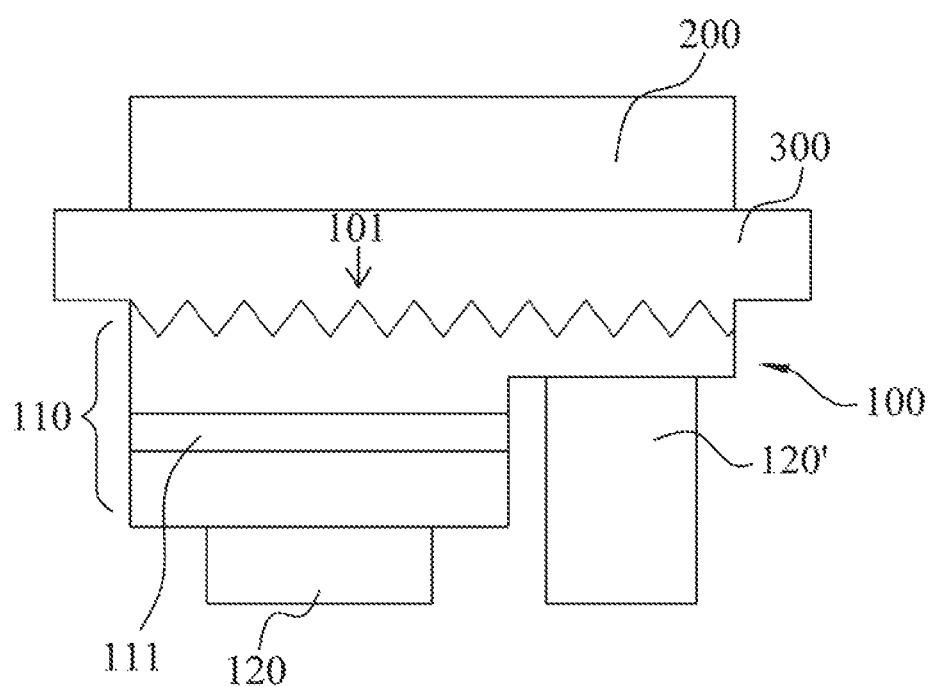
FIG. 3 is a cross-sectional view illustrating a second embodiment of the micro light-emitting device according to the disclosure.

Referring to FIG. 3, a second embodiment of the micro light-emitting device according to the present disclosure is generally similar to the variation of the first embodiment, except that in the second embodiment, an upper surface 101 of the micro light-emitting diode 100 facing the light-emitting structure 200 and serving as a light-emitting surface to allow the excitation light E1 to pass therethrough and enter into the bonding layer 300, is formed as a roughened surface. The roughed upper surface 101 is filled with the material of the bonding layer 300, so as to reduce total reflection of light at an interface between the bonding layer 300 and the semiconductor light-emitting unit 110, thereby increasing light-emitting efficiency of the micro light-emitting diode 100. The pattern of the roughed upper surface 101 of the micro light-emitting diode 100 may be present in a regular manner or in an irregular manner. In certain embodiments, a top surface of the light-emitting structure 200 that is opposite to the micro light-emitting diode 100 may also be formed as a roughened surface (not shown) similar to the roughed upper surface 101.

Figure 4:
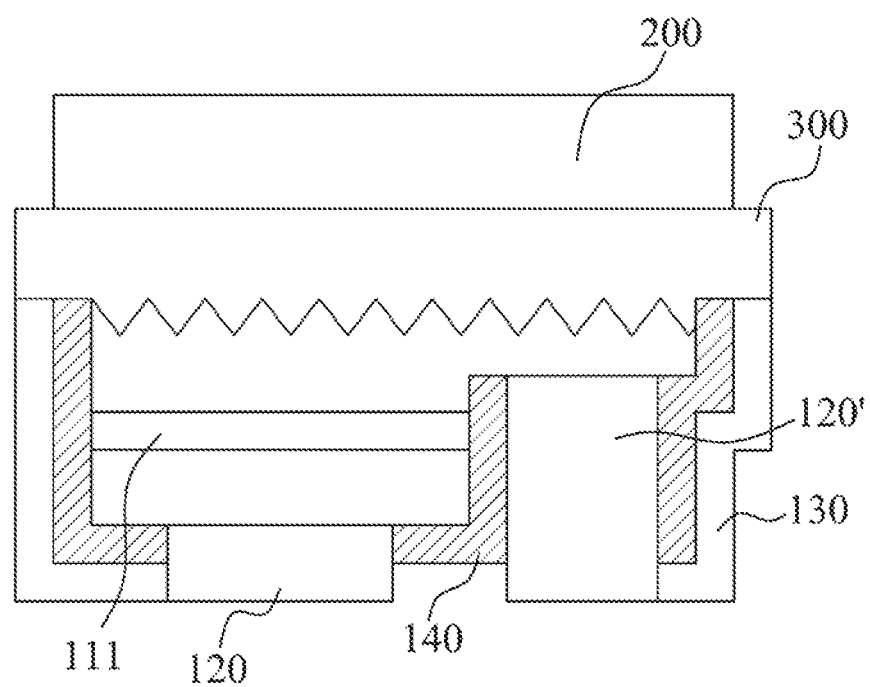
FIG. 4 is a cross-sectional view illustrating a third embodiment of the micro light-emitting device according to the disclosure.

Referring to FIG. 4, a third embodiment of the micro light-emitting device according to the present disclosure is generally similar to the second embodiment, except that in the third embodiment, the micro light-emitting device further includes a light reflection layer (or a light blocking layer) 130 disposed on the micro light-emitting diode 100 opposite to the light-emitting structure 200 to prevent the excitation light E1 from leaking through a sidewall of the micro light-emitting diode 100. Specifically, the light reflection layer (or the light blocking layer) 130 may at least cover a portion of a peripheral region or a bottom region of the micro light-emitting diode 100, thereby preventing leakage of the excitation light E1 and increasing the light-emitting efficiency of the micro light-emitting device. The light reflection layer (or the light blocking layer) 130 may be made of a conductive material. In such case, the micro light-emitting device further includes an insulating protective layer 140 that is disposed between the light reflection layer 130 and the semiconductor light-emitting unit 110, so as to avoid short circuit of the micro light-emitting diode 100.

Figure 5:
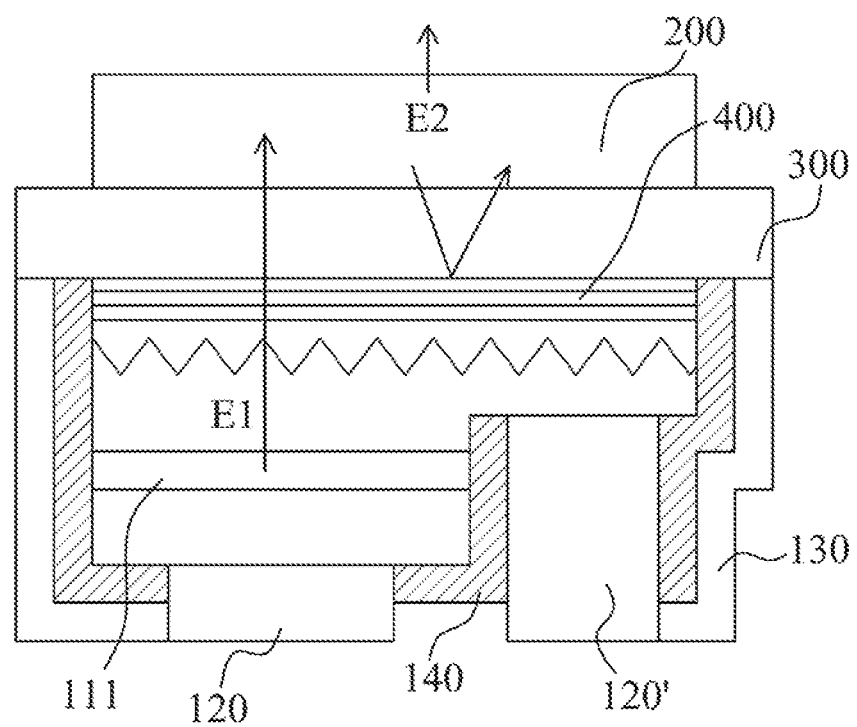
FIG. 5 is a cross-sectional view illustrating a fourth embodiment of the micro light-emitting device according to the disclosure.
Figure 6:
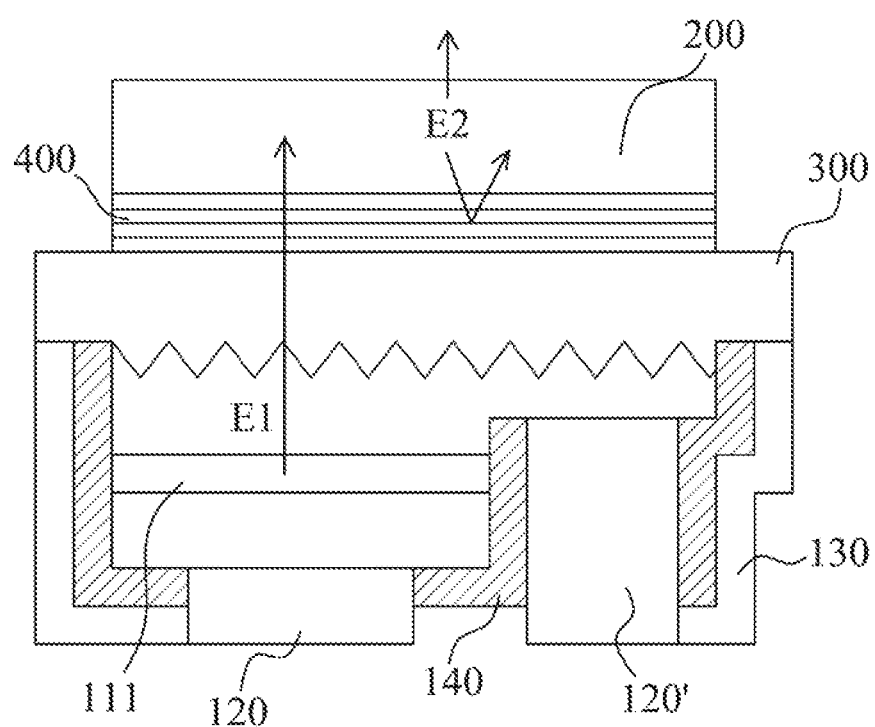
FIGS. 6 and 7 are cross-sectional views illustrating variations of the fourth embodiment.
Figure 7:
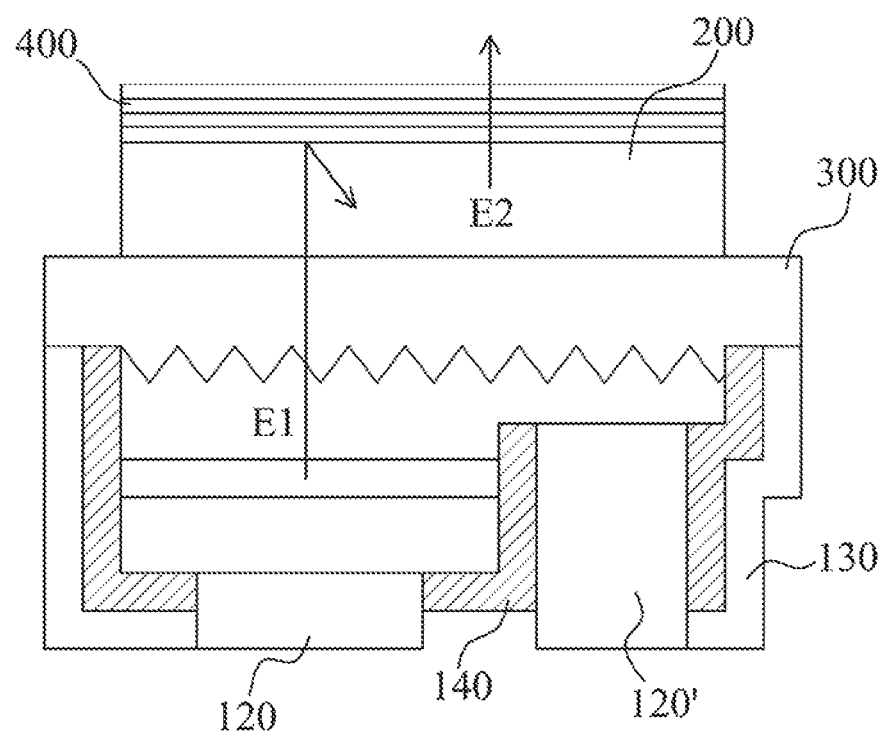

Referring to FIGS. 5 to 7, a fourth embodiment of the micro light-emitting device according to the present disclosure and two variations thereof are generally similar to the third embodiment, except that in the fourth embodiment, the micro light-emitting device further includes an anti-reflection layer 400 disposed on one of two opposite sides of the light-omitting structure 200, so as to reduce or prevent leakage of the excitation light E1 and to increase the light-emitting efficiency of the light-emitting structure 200. The anti-reflection layer 400 may be made of a transparent dielectric material, and may be formed as one of a single layer structure and a multi-layered structure with different refractive indices.

Specifically, in the fourth embodiment, the anti-reflection layer 400 is disposed between the light-emitting structure 200 and the bonding layer 300 (see FIG. 5). In a first variation of the fourth embodiment, the anti-reflection layer 400 is disposed between the bonding layer 300 and the semiconductor light-emitting unit 110, as shown in FIG. 6. When the anti-reflection layer 400 is disposed on a side of the light-emitting structure 200 similar as the semiconductor light-emitting unit 110, the anti-reflection layer 400 may have a wavelength selectivity to allow the excitation light E1 emitted from the semiconductor light-emitting unit 110 to pass therethrough, and to reflect the excited light E2 emitted from the light-emitting structure 200.

In a second variation of the fourth embodiment, the anti-reflection layer 400 is disposed on a side of the light-emitting structure 200 opposite to the semiconductor light-emitting unit 110, as shown in FIG. 7. In such case, the anti-reflection layer 400 may have a wavelength selectivity to allow the excited light E2 emitted from the light-emitting structure 200 to pass therethrough, and to reflect the excitation light E1 emitted from the semiconductor light-emitting unit 110. The reflected excitation light E1 is then allowed to be absorbed by the light-emitting structure 200 again, so as to excite the same to emit more of the excited light E2 (i.e., only the excited light E2 is allowed to exit out of the micro light-emitting device), thereby increasing the light-emitting efficiency of the micro light-emitting device.

Figure 8:
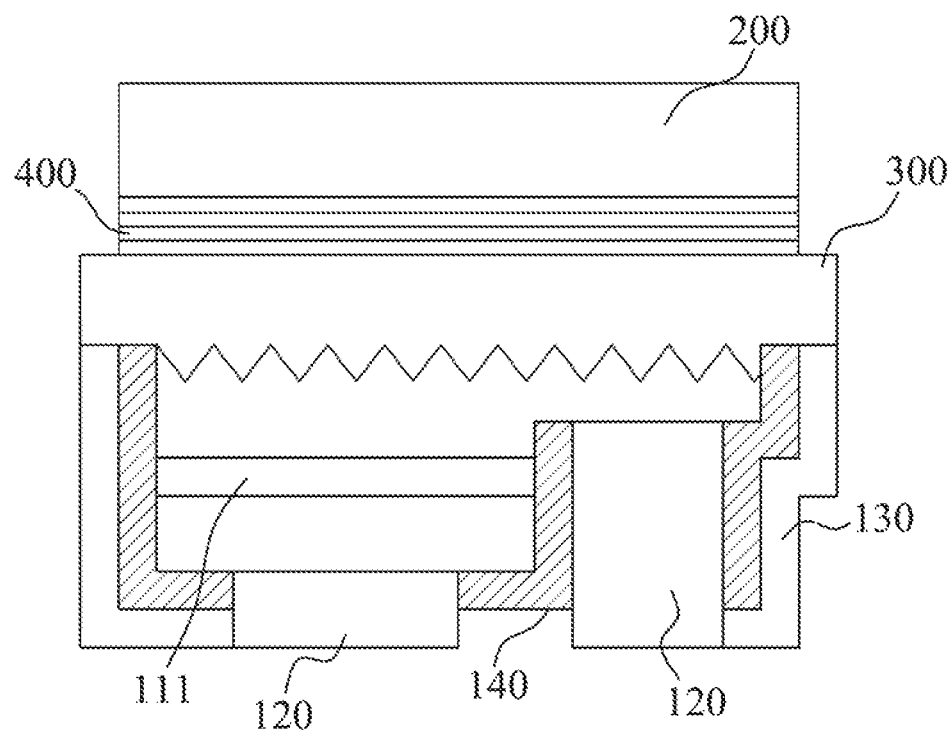
FIG. 8 is a cross-sectional view illustrating a fifth embodiment of the micro light-emitting device according to the disclosure.

Referring to FIG. 8, a fifth embodiment of the micro light-emitting device according to the present disclosure is generally similar to the first variation of the fourth embodiment, except that in the fifth embodiment, an area of a projection of the light-emitting structure 200 on the bonding layer 300 may be enlarged and/or an area of a projection of the anti-reflection layer 400 on the bonding layer 300 may be enlarged, which is conducive for absorbing more excitation light E1, and preventing the excitation light E1 from interfering with the excited light E1. In certain embodiments, the area of the projection of the light-emitting structure 200 on the bonding layer 300 may be greater than that of the semiconductor light-emitting unit 110, so as to prevent the leakage of the excitation light E1 and to reduce color rendering effect.

Figure 9:
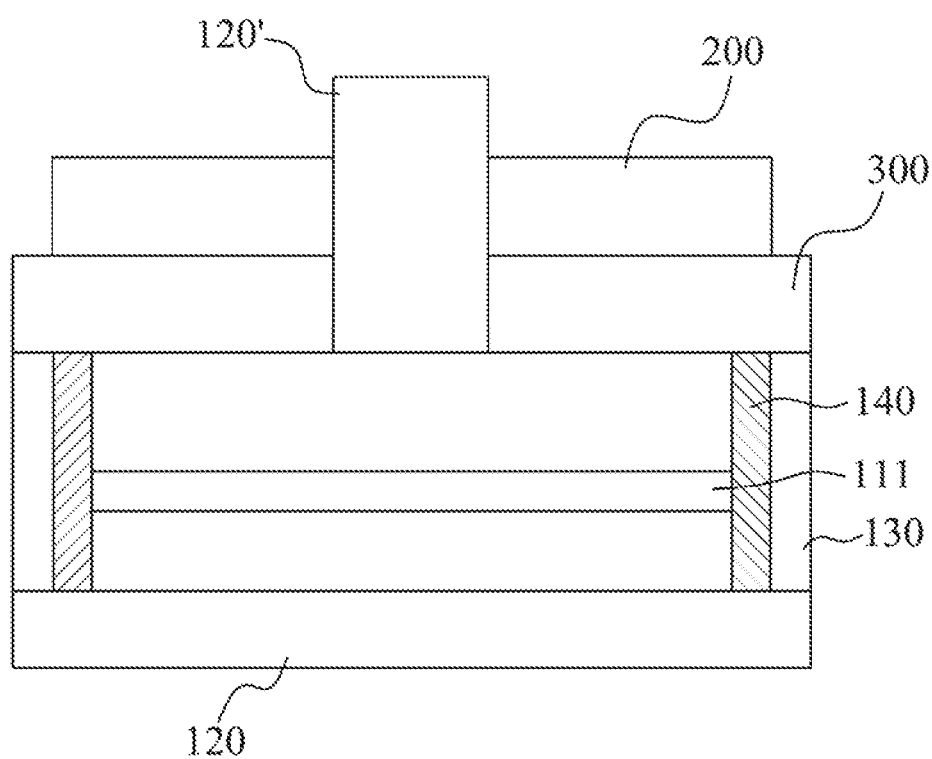
FIG. 9 is a cross-sectional view illustrating a sixth embodiment of the micro light-emitting device according to the disclosure.

Referring to FIG. 9, a sixth embodiment of the micro light-emitting device according to the present disclosure is generally similar to the third embodiment, except that in the sixth embodiment, the micro light-emitting device has a vertical structure in which the electrodes 120, 120' are disposed on two opposite sides of the micro light-emitting diode 100.

The present disclosure also provides a display which includes the abovementioned micro light-emitting device.

In summary, by virtue of forming the light-emitting structure 200 as a multiple quantum well structure that is capable of efficiently absorbing and being excited by the excitation light E1 (e.g., a blue light or a green light) to emit the excited light E2 (e.g., a red light), as compared with a conventional micro light-emitting device, the micro light-emitting device according to this disclosure has an improved light conversion efficiency, a lower manufacturing cost, and an uniformity of light output, thereby meeting various practical application.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting device, comprising:
   a micro light-emitting diode including a semiconductor light-emitting unit that emits an excitation light having a first wavelength;
   a light-emitting structure disposed on said micro light-emitting diode and configured to be excited by said excitation light to emit an excited light having a second wavelength;
   a bonding layer disposed between said micro light-emitting diode and said light-emitting structure; and
   an anti-reflection layer disposed between said light-emitting structure and said bonding layer, or between said bonding layer and said semiconductor light-emitting unit;
   wherein said light-emitting structure is a multiple quantum well structure, and
   wherein said anti-reflection layer has a wavelength selectivity to allow said excitation light to pass therethrough and to reflect said excited light.

2. The micro light-emitting device of claim 1, wherein said bonding layer has a thickness ranging from 0.01 μm to 100 μm.

3. The micro light-emitting device of claim 1, wherein said bonding layer is made of a material selected from the group consisting of silicon dioxide ($SiO_2$), silicon nitride (SiN), indium tin oxide (ITO), aluminium oxide ($Al_2O_3$), resin, silicone, and combinations thereof.

4. The micro light-emitting device of claim 1, wherein said anti-reflection layer is made of a transparent dielectric material and is formed as one of a single layer structure and a multi-layered structure.

5. The micro light-emitting device of claim 1, wherein an upper surface of said micro light-emitting diode that faces said light-emitting structure is formed as a roughened surface.

6. The micro light-emitting device of claim 1, wherein an upper surface of said light-emitting structure that is opposite to said micro light-emitting diode is formed as a roughened surface.

7. The micro light-emitting device of claim 1, wherein said micro light-emitting device is configured to emit only said excited light, and said first wavelength of said excitation light is shorter than said second wavelength of said excited light.

8. The micro light-emitting device of claim 7, wherein said first wavelength ranges from 380 nm to 550 nm.

9. The micro light-emitting device of claim 7, wherein said second wavelength ranges from 570 nm to 780 nm.

10. The micro light-emitting device of claim 1, wherein said semiconductor light-emitting unit includes a quantum well structure made of a GaN-based material.

11. The micro light-emitting device of claim 10, wherein said light-emitting structure is made of an AlGaInP-based material.

12. The micro light-emitting device of claim 11, wherein said light-emitting structure includes multiple pairs of layers, said layers in each pair including a barrier layer and a well layer, said barrier layers and said well layers in said light-emitting structure being alternately stacked, and each of said well layers being made of $Ga_{0.51}In_{0.49}P$.

13. The micro light-emitting device of claim 12, wherein each of said well layers of said light-emitting structure has a thickness ranging from 3.8 nm to 4.2 nm.

14. The micro light-emitting device of claim 12, wherein each of said barrier layers is made of AlInP.

15. The micro light-emitting device of claim 14, wherein each of said barrier layers of said light-emitting structure has a thickness ranging from 1.5 nm to 3 nm.

16. The micro light-emitting device of claim 12, wherein said light-emitting structure includes at least 20 pairs of layers.

17. The micro light-emitting device of claim 12, wherein said first wavelength of said excitation light ranges from 500 nm to 550 nm, and a number of said pairs of layers of said light-emitting structure ranges from 65 to 75.

18. The micro light-emitting device of claim 12, wherein said first wavelength of said excitation light ranges from 380 nm to 500 nm, and a number of said pairs of layers of said light-emitting structure ranges from 45 to 55.

19. The micro light-emitting device of claim 1, further comprising a light reflection layer disposed on said micro light-emitting diode opposite to said light-emitting structure.

20. The micro light-emitting device of claim 1, wherein an area of said light-emitting structure is greater than that of said semiconductor light-emitting unit.

21. The micro light-emitting device of claim 1, wherein one of a length, a width, and a height of said micro light-emitting diode ranges from 2 μm to 100 μm.

22. A display, comprising a micro light-emitting device as claimed in claim 1.

* * * * *